US006582997B1

(12) United States Patent
Lee et al.

(10) Patent No.: US 6,582,997 B1
(45) Date of Patent: Jun. 24, 2003

(54) ESD PROTECTION SCHEME FOR OUTPUTS WITH RESISTOR LOADING

(75) Inventors: Jian-Hsing Lee, Hsin-chu (TW); Shui-Hun Chen, Hsin-chu (TW); Jiaw-Ren Shih, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/150,833

(22) Filed: May 17, 2002

(51) Int. Cl.[7] ......................................... H01L 21/8238
(52) U.S. Cl. ....................... 438/208; 438/210; 438/220
(58) Field of Search ................. 438/FOR 211, 438/205, 208, 210, 220, 281, 286, 598, FOR 187, FOR 217

(56) References Cited

U.S. PATENT DOCUMENTS

| 4,789,917 A | * 12/1988 | Miller | 361/56 |
|---|---|---|---|
| 5,159,518 A | * 10/1992 | Roy | 361/56 |
| 5,246,872 A | * 9/1993 | Mortensen | 438/200 |
| 5,576,557 A | 11/1996 | Ker et al. | 257/173 |
| 5,594,326 A | 1/1997 | Gilbert | 323/313 |
| 5,825,601 A | 10/1998 | Statz et al. | 361/56 |
| 6,130,117 A | 10/2000 | Walker et al. | 438/133 |
| 6,147,538 A | 11/2000 | Andresen et al. | 327/309 |
| 6,274,908 B1 | * 8/2001 | Yamaguchi et al. | 257/355 |
| 6,420,221 B1 | * 7/2002 | Lee et al. | 438/199 |
| 6,448,123 B1 | * 9/2002 | Lee et al. | 438/200 |
| 6,459,139 B2 | * 10/2002 | Watanabe et al. | 257/551 |

* cited by examiner

*Primary Examiner*—George Fourson
*Assistant Examiner*—Thanh V Pham
(74) *Attorney, Agent, or Firm*—George O. Saile; Stephen B. Ackerman

(57) ABSTRACT

Disclosed are structures and a method to increase the power dissipation of an output pad of an integrated circuit during electrostatic discharge (ESD) by preventing ESD current from flowing through resistive means between that output pad and an internal circuit. By splitting the active region and thereby creating a bipolar transistor which connects directly to the output pad, the resistive means is shunted when the bipolar transistor together with an already existing parasitic bipolar transistor conduct during ESD. Current flow in the resistive means is therefore eliminated and with it damaging power dissipation.

3 Claims, 3 Drawing Sheets

ESD PROTECTION SCHEME FOR OUTPUTS WITH RESISTOR LOADING

BACKGROUND OF THE INVENTION

1. Field of the Invention

The invention relates to electrostatic discharge (ESD) protection circuits, and more particularly to ESD protection for NMOS/PMOS circuits with an output resistor between an internal circuit and the output pad.

2. Description of the Related Art

Integrated circuits (IC) are susceptible to damage caused by electrostatic discharge from environmental sources. Such sources of relative charge are people handling the wafer, die, or packaged IC, improperly grounded test and assembly equipment, and the device itself, which may accumulate charge during storage and transport. To avoid these post-fabrication yield losses, each IC must be designed to withstand the likely types of environmental electrostatic discharge it may face. The basic models used are the Human Body Model (HBM) and the Machine Model (MM). Circuits which require an output resistor are particularly vulnerable because the output resistor causes unacceptable power dissipation during an ESD and, therefore, degrades the ESD performance.

U.S. Patents which relate to ESD protection are:

U.S. Pat. No. 5,825,601 (Statz et al.) relates to a power supply ESD protection circuit which reduces on-die capacitance requirements.

U.S. Pat. No. 6,147,538 (Andresen et al.) shows a CMOS triggered NMOS ESD protection circuit having amplifier circuitry to increase substrate pump current response.

U.S. Pat. No. 6,130,117 (Walker) discloses improved devices and methods for manufacturing ESD and OV protection devices.

U.S. Pat. No. 5,576,557 (Ker et al.) teaches an ESD circuit for protecting a semiconductor integrated circuit, where the ESD circuit connects between a circuit pad and the internal circuitry of the integrated circuit.

None of the above-cited examples of the related art address the problem of degraded output pad ESD performance and excessive power dissipation caused by output resistor loading.

SUMMARY OF THE INVENTION

It is an object of at least one embodiment of the present invention to provide structures and a method to increase the power dissipation of an output pad of an integrated circuit during electrostatic discharge (ESD).

It is another object of the present invention to prevent ESD current flowing through resistive means between an output pad and an internal circuit.

It is yet another object of the present invention to provide these benefits to CMOS circuits.

These and many other objects have been achieved by splitting the drain of the NMOS and PMOS transistors to build a bipolar transistor. This bipolar transistor in conjunction with an existing parasitic bipolar transistor (created by a MOS transistor) shorts out or shunts the resistive means between the output pad and the internal circuit when both bipolar transistors conduct during ESD, thus eliminating any current flow in the resistive means. The active region (also called OD) connects directly to the output pad to act as the primary ESD protection device where the aforementioned bipolar transistor bypasses most of the ESD current. Because the bipolar transistor and the parasitic transistor both conduct there is no voltage drop across the resistive means and, therefore, no power dissipation through it.

These and many other objects and advantages of the present invention will be readily apparent to one skilled in the art to which the invention pertains from a perusal of the claims, the appended drawings, and the following detailed description of the preferred embodiments.

In the following, first and second conductivity types are opposite conductivity types, such as N and P types. Each embodiment includes its complement as well. Note also that the figures herein illustrate vertical cross sections of devices and that the devices extend laterally (into and/or out of the page) in a manner appreciated by those skilled in the art.

DESCRIPTION OF THE PREFERRED EMBODIMENT

The present invention provides a very successful solution of the problem of excessive power dissipation in an output resistor during electrostatic discharge (ESD). This is achieved by introducing a bipolar transistor to the NMOS/PMOS transistor protection circuits having an output resistor. This bipolar transistor then becomes the primary ESD protection device by carrying most of the ESD current. The collector of this new bipolar transistor couples to the junction of the output resistor and the output pad and parallels an existing parasitic bipolar transistor which couples to the other end of the output resistor. During ESD both bipolar transistors turn on thus shorting out the output resistor thereby preventing the ESD current from passing through the output resistor. Since the output resistor is typically about 5 ohms and because the ESD current flowing through it is typically 2 to 3 amperes the power dissipated by the resistor is significant causing the output resistor to burn out, thus damaging the IC.

Figure 1:
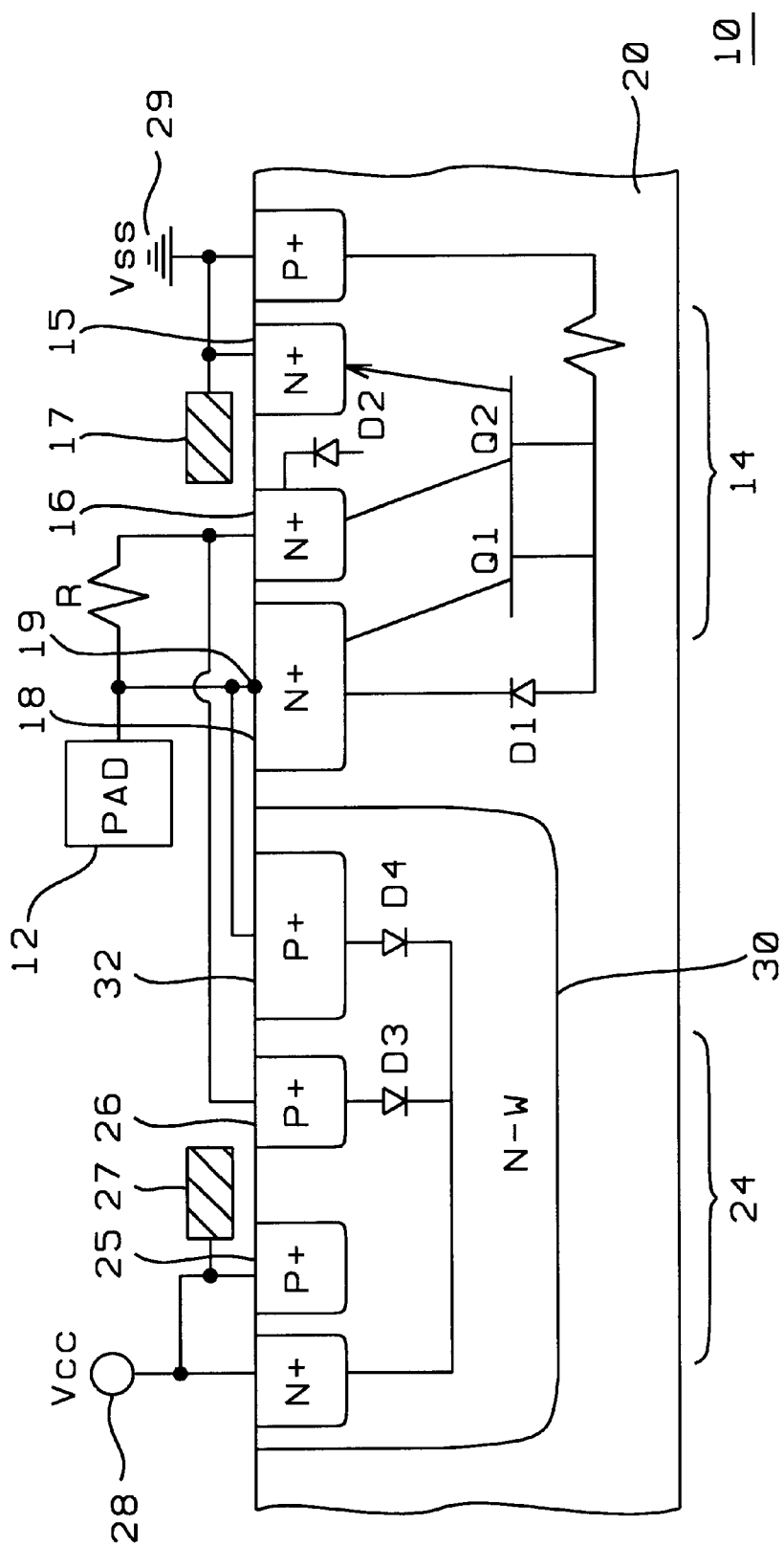
FIG. 1 is a cross-sectional view of the NMOS section of a first preferred embodiment of the present invention.
Figure 2:
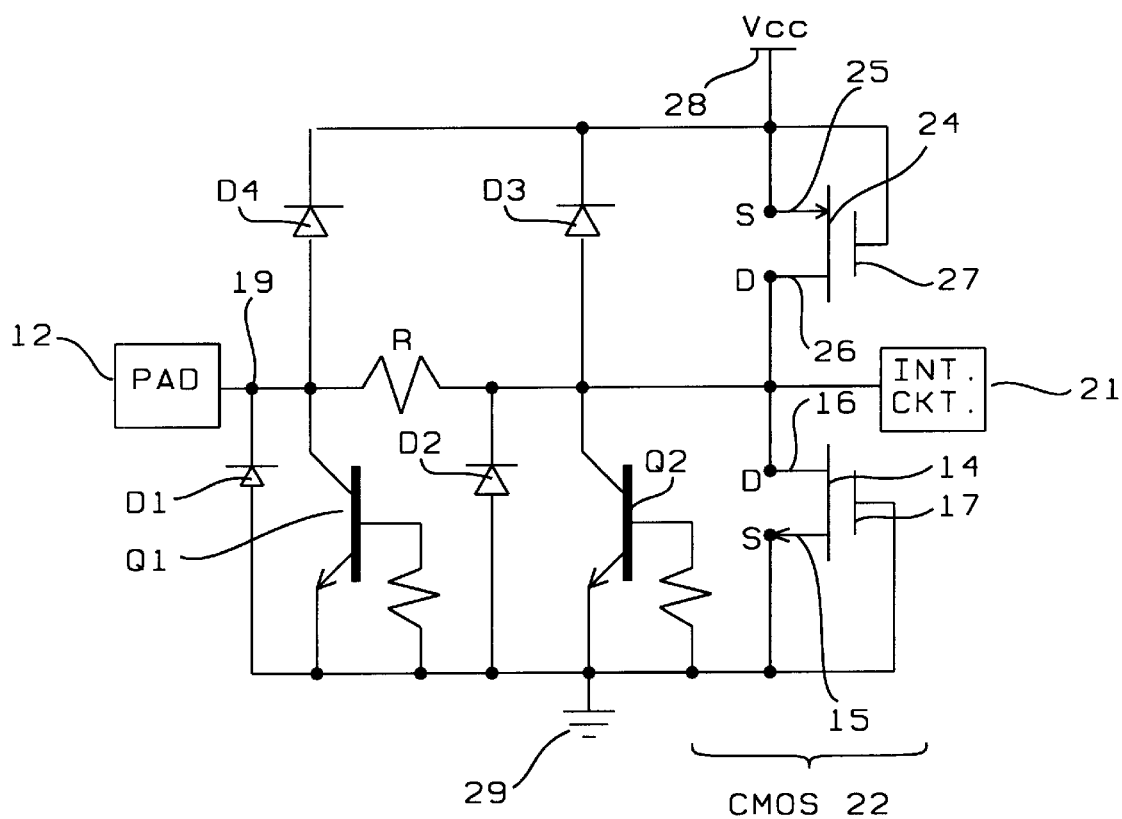
FIG. 2 is a circuit diagram the first preferred embodiment including the NMOS section of FIG. 1.

Turning now to FIGS. 1 and 2 we provide a more detailed description of one preferred embodiment of the present invention illustrating, by way of example, an NMOS transistor circuit.

The structure 10 for electrostatic discharge (ESD) protection of the output pad 12 comprises a MOS transistor 14 of a first conductivity type having a source 15, a drain 16, and a gate 17, where MOS transistor 14 is deposited in a region 20 of a second conductivity type of a semiconductor substrate. A resistive means R is coupled between the drain of MOS transistor 14 and output pad 12. A heavily doped region 18 of first conductivity type is deposited adjacent to the drain of MOS transistor 14 in region 20 (this arrangement being called a split drain). Heavily doped region 18 (illustrated as N+ in FIG. 1) is then coupled via contact 19 to output pad 12. Typically the gate 17 is tied to the power supply return terminal 29. A first parasitic bipolar transistor Q2 of first conductivity type is created by the MOS transistor 14. The emitter, collector, and base of Q2 are equivalent to the source and drain of MOS transistor 14 and region 20, respectively. A second parasitic bipolar transistor Q1 of first conductivity type (both Q2 and Q1 are illustrated as a npn in FIGS. 1 and 2) is created by the heavily doped region 18 and MOS transistor 14. The collector, base, and emitter, of Q1 are equivalent to heavily doped region 18, region 20, and the source of MOS transistor 14, respectively. Parasitic diodes D2 and D1 are formed by the collector-base junction of transistors Q2 and Q1, respectively. Parasitic bipolar transistor Q1 acts as the primary ESD protection device as will be explained next. An ESD causes the first and second parasitic bipolar transistor Q2, Q1 to conduct via drain 16, region 18, respectively, and source 15 to the power supply return terminal 29, thus shunting resistive means R. Because resistive means R is shunted no current flows through it which protects it from destructive power levels and increases the power dissipation of output pad 12 during an ESD. The second parasitic bipolar transistor Q1 will act as the primary ESD protection device because without resistive means R in its path it will conduct from 80% to 100% of the ESD current to $V_{cc}$ 28; while resistive means R will limit the current through Q2.

The circuit diagram of FIG. 2 along with structure 10 of FIG. 1, typically also comprises another MOS transistor 24 of a second conductivity type (illustrated is a PMOS transistor in FIG. 1 and FIG. 2) deposited in a region of first conductivity type 30, which has its source 25 and drain 26 coupled between power supply 28 ($V_{cc}$) and drain 16 of MOS transistor 14, respectively. MOS transistors 14 and 24 together form CMOS 22 as indicated in FIG. 2. Gate 27 of MOS transistor 24 typically is coupled to power supply 28. A heavily doped region 32 of second conductivity type is deposited adjacent to the drain of MOS transistor 24 (this arrangement being called a split drain) in region 30. A parasitic diode D3 of MOS transistor 24 is formed by drain 26 and region 30, shown here as an N-well. Similarly, a parasitic diode D4 is formed by the split drain 32 of MOS transistor 24 and region 30. Split drain 32 is coupled directly to pad 12 via contact 19. An internal circuit 21 is coupled via resistive means R to output pad 12, see FIG. 2. Parasitic diode D4 will act as the primary ESD protection device because without resistive means R in its path it will conduct from 80% to 100% of the ESD current to $V_{cc}$; whereas resistive means R will limit the current through parasitic diode D3.

Results of tests of the above described structure of the present invention are shown in Table 1 for 3.3V NMOS structures. In a test chip the various new ESD protection structures are developed for improving NMOS ESD performance. Table 1 lists the +HBM/Vss, +MM/Vss, and IT-2 measurement results for 3.3V NMOS. For evaluating worst case conditions all gates of the device during test are floating. Note that OD stands for active area, that PO is protection oxide and RPO is resistor protection oxide.

TABLE 1

| | | | 3.3 V NMOS | | | |
|---|---|---|---|---|---|---|
| Device | W/L | RPO/offset | Resistor | HBM (KV) | MM (V) | IT2 (A) |
| NMOS | 120/.4 | 1.5/0 | N/A | 1.5 | 50 | 0.96 |
| NMOS | 360/.4 | 1.5/0 | N/A | 3.5 | 175 | 1.9 |
| NMOS | 360/.4 | 1.5/0.45 | N/A | 2.5 | 100 | 1.69 |
| NPN + R + NMOS | 360/.4 | 1.5/0 | N + OD 8Ω | 7.5 | 375 | 3.5 |
| NPN + R + NMOS | 360/.4 | 1.5/0 | N + OD 3.4Ω | 8.0 | 400 | 3.6 |
| NPN + R + NMOS | 360/.4 | 1.5/0 | N + OD 1.6Ω | 5.5 | 200 | 3.5 |
| NPN + R + NMOS | 360/.4 | 1.5/0 | N + OD 1Ω | 5.5 | 175 | 2.6 |
| NPN + R + NMOS | 360/.4 | 1.5/0 | N + PO 9.5Ω | 6.5 | 350 | 3.2 |
| NPN + R + NMOS | 360/.4 | 1.5/0 | N + PO 4.7Ω | 5.0 | 350 | 2.8 |

Table 1 illustrates the test results for a 3.3V NMOS structure as shown in FIGS. 1 and 2 of the present invention, where the 3.3V NMOS structure will withstand a human body model (HBM) test ranging from 5 to 8 kvolt when resistive means R ranges from 1 ohm to 9.5 ohm. Similarly, this structure will withstand a machine model (MM) test ranging from 175 volt to 400 volt when resistive means R ranges from 1 ohm to 9.5 ohm. By comparison the first three entries of Table 1 show that the standard NMOS structure will only withstand a HBM test ranging from 1.5 to 3.5 kvolt and a MM test ranging from 50 to 175 volt at a lower current IT2.

Figure 3:
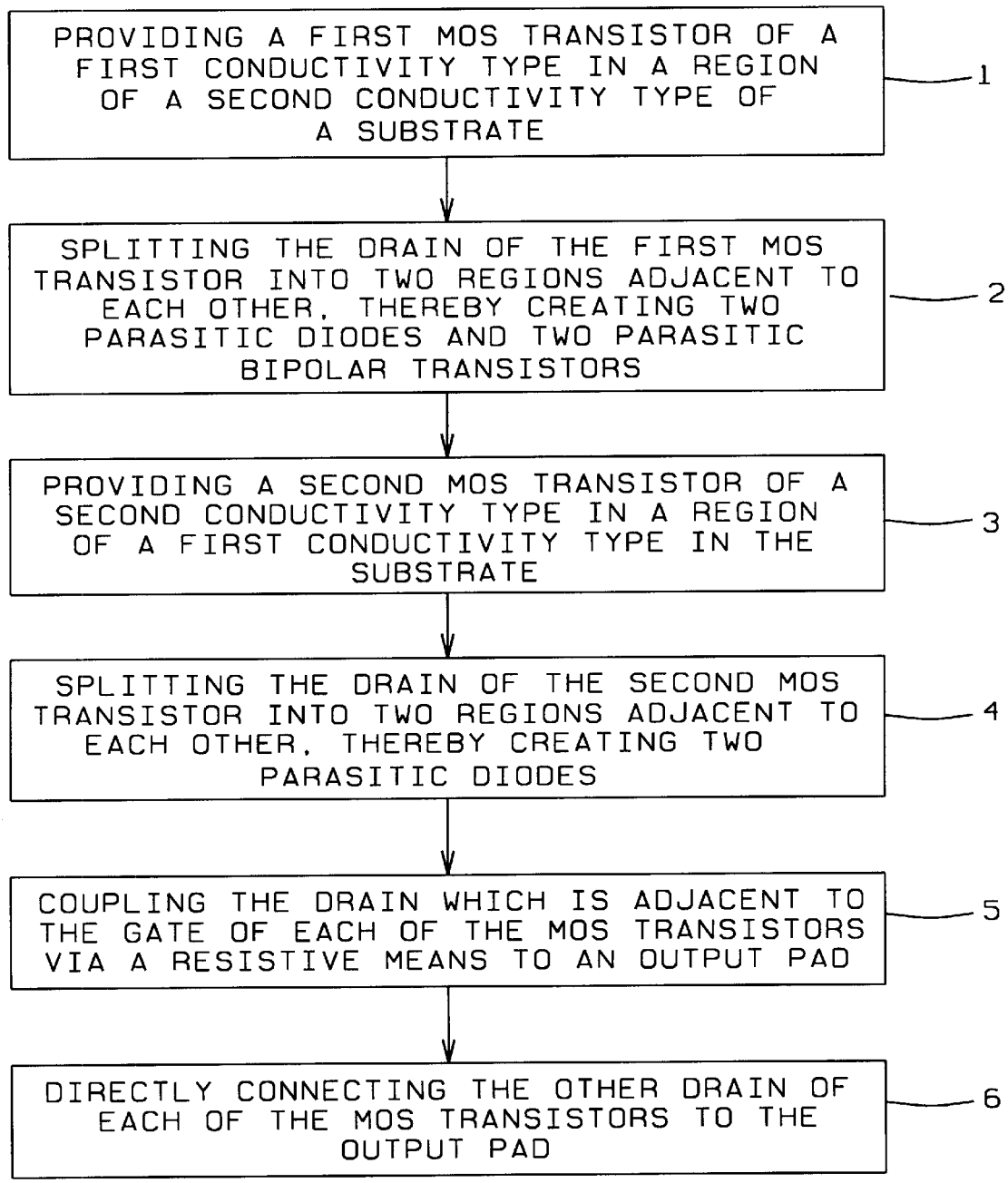
FIG. 3 is a high level block diagram of the method of the invention. In the figures like parts are identified by like numerals or symbols.

We now illustrate in FIG. 3 a method for protecting from electrostatic discharge (ESD) the output of an integrated circuit with resistor loading, comprising the following steps.

BLOCK 1: providing a first MOS transistor of a first conductivity type in a region of a second conductivity type of a semiconductor substrate.

BLOCK 2: splitting the drain of the first MOS transistor into two regions adjacent to each other, thereby creating two parasitic diodes and two parasitic bipolar transistors.

BLOCK 3: providing a second MOS transistor of a second conductivity type in a region of a first conductivity type in the semiconductor substrate.

BLOCK 4: splitting the drain of the second MOS transistor into two regions adjacent to each other, thereby creating two parasitic diodes.

BLOCK 5: coupling the drain which is adjacent to the gate of each of the MOS transistors, via a resistive means, to an output pad.

BLOCK 6: directly connecting the other drain of each of the MOS transistors to the output pad.

While the invention has been particularly shown and described with reference to the preferred embodiments thereof, it will be understood by those skilled in the art that various changes in form and details may be made without departing from the spirit and scope of the invention.

What is claimed is:

1. A method for protecting from electrostatic discharge (ESD) the output of an integrated circuit with resistor loading, comprising the steps of:
   a) providing a first MOS transistor of a first conductivity type in a region of a second conductivity type of a semiconductor substrate;
   b) splitting the drain of said first MOS transistor into two regions adjacent to each other, thereby creating two parasitic diodes and two parasitic bipolar transistors;
   c) providing a second MOS transistor of a second conductivity type in a region of a first conductivity type in the semiconductor substrate;
   d) splitting the drain of said second MOS transistor into two regions adjacent to each other, thereby creating two parasitic diodes;
   e) coupling the drain which is adjacent to the gate of each of said MOS transistors, via a resistive means, to an output pad; and
   f) connecting the other drain of each of said MOS transistors to said output pad.

2. The method of claim 1, wherein of the two parasitic bipolar transistors of said first MOS transistor the directly connected parasitic bipolar transistor will conduct from 80% to 100% of the ESD current.

3. The method of claim 1, wherein of the two parasitic diodes of said second MOS transistor the directly connected parasitic diode of will conduct from 80% to 100% of the ESD current.

* * * * *